US00RE36532E

United States Patent [19]

Kim

[11] E Patent Number: Re. 36,532

[45] Reissued Date of Patent: Jan. 25, 2000

[54] SYNCHRONOUS SEMICONDUCTOR MEMORY DEVICE HAVING AN AUTO-PRECHARGE FUNCTION

[75] Inventor: Gyu-Hong Kim, Seoul, Rep. of Korea

[73] Assignee: Samsung Electronics Co., Ltd., Rep. of Korea

[21] Appl. No.: 09/151,414

[22] Filed: Sep. 10, 1998

Related U.S. Patent Documents

Reissue of:

[64] Patent No.: 5,555,526
Issued: Sep. 10, 1996
Appl. No.: 08/397,689
Filed: Mar. 2, 1995

[51] Int. Cl.[7] ..... G11C 8/00

[52] U.S. Cl. ..... 365/203; 365/191; 365/194

[58] Field of Search ..... 365/203, 191, 365/193, 194, 233

[56] References Cited

U.S. PATENT DOCUMENTS

| | | | |
|---|---|---|---|
| Re. 35,750 | 3/1998 | Casper et al. | 365/203 |
| 4,417,328 | 11/1983 | Ochii | 365/203 |
| 4,581,722 | 4/1986 | Takemae | 365/230 |
| 4,636,989 | 1/1987 | Ikuzaki | 365/222 |
| 4,856,106 | 8/1989 | Teraoka | 365/203 |
| 4,907,199 | 3/1990 | Dosaka et al. | 365/189.04 |
| 5,029,135 | 7/1991 | Okubo | 365/203 |
| 5,047,984 | 9/1991 | Monden | 365/203 |
| 5,177,573 | 1/1993 | Utika et al. | 365/189.03 |
| 5,357,474 | 10/1994 | Matano et al. | 365/203 |
| 5,416,743 | 5/1995 | Allan et al. | 365/203 |
| 5,430,680 | 7/1995 | Parris | 365/222 |
| 5,463,581 | 10/1995 | Koshikawa | 365/189.01 |
| 5,463,590 | 10/1995 | Watanabe | 365/230.03 |
| 5,485,426 | 1/1996 | Lee et al. | 365/203 |
| 5,604,704 | 2/1997 | Atsumo | 365/203 |
| 5,625,598 | 4/1997 | Oba | 365/203 |
| 5,631,871 | 5/1997 | Park et al. | 365/203 |
| 5,636,173 | 6/1997 | Schaefer | 365/230.03 |
| 5,650,977 | 7/1997 | Kyung et al. | 368/230.03 |
| 5,715,203 | 2/1998 | Uchida | 365/203 |
| 5,748,560 | 5/1998 | Sawada | 365/233 |
| 5,764,577 | 6/1998 | Johnston et al. | 365/200 |

FOREIGN PATENT DOCUMENTS

| | | |
|---|---|---|
| 0 468 135 A2 | 1/1992 | European Pat. Off. . |
| 6-318391 | 11/1994 | Japan . |
| 2 219 418A | 6/1989 | United Kingdom . |

OTHER PUBLICATIONS

"Der Weg zum besseren DRAM," Design & Elektronik, 19 vom, Sep. 14, 1993, pp. 66–73.

"Synchronous DRAMs Clock at 100 MHz," Electronic Design, Feb. 18, 1993, pp. 45–49.

"Mitsubishi Samples 16M Synch DRAM: Mitsubishi Electron Amer: To Into 3.3–volt 16Mbit Synchronous DRAMs for Graphics", Electronic News, Oct. 25, 1993, pp. 28.

"3.3–Volt, 16–Meg Synchronous DRAM Now Available", News Release, Feb. 15, 1993.

JEDEC Standard No. 21–C, Dec. 8, 1993.

Eaton, "Session XII: Dynamic Memories—THPM 12.3: A 5V–Only 2K×8 Dynamic RAM", IEEE International Solid–State Circuits Conference, 1979, pp. 144–145.

*Primary Examiner*—Son Mai

*Attorney, Agent, or Firm*—Myers Bigel Sibley & Sajovec

[57] ABSTRACT

A semiconductor memory device according to the present invention having a plurality of memory banks, a row address strobe signal buffer, a column address strobe signal buffer and a column address generator and performing a data access operation in response to the burst length and latency information related to a system clock having a predetermined frequency, comprises a device for generating a signal which automatically precharges one memory bank of the memory banks in response to the row address strobe signal and the signal having the burst length and latency information after an address operation for the memory bank is completed.

37 Claims, 8 Drawing Sheets

SYNCHRONOUS SEMICONDUCTOR MEMORY DEVICE HAVING AN AUTO-PRECHARGE FUNCTION

Matter enclosed in heavy brackets [ ] appears in the original patent but forms no part of this reissue specification; matter printed in italics indicates the additions made by reissue.

BACKGROUND OF THE INVENTION

The present invention relates to a semiconductor memory device for precharging a row chain, and particularly to a synchronous semiconductor memory device for automatically precharging the row chain.

The synchronous semiconductor memory device, which has been developed for high speed operation, performs all operations required in accessing data corresponding to a system clock (or a synchronous clock) of constant period supplied from externally. With the use of a mode set register, such a synchronous semiconductor memory device sets various operation modes for determining the latency and burst length. In semiconductor memory device, if a read or write operation of one row is completed, the activated row chain must be precharged in order to perform the read or write operation of another row.

As shown in FIG. 1, in a conventional semiconductor memory device, the row chain is precharged only when a precharge command is applied from the exterior of the device after one row has been activated. In a synchronous semiconductor memory device which operates with an external system clock and performs the read/write operation in accordance with the determined burst length and latency information, if the precharge operation of the row chain is performed in response to the precharge command applied from the exterior, as described above, undesirably forcibly determines the proper point in time for precharging the row chain and it is therefore difficult to realize an effective (i.e. reduction of the power consumption) precharge operation.

SUMMARY OF THE INVENTION

It is therefore an object of the present invention to provide a synchronous semiconductor memory device which is capable of internally and automatically precharging a row chain.

It is another object of the present invention to provide the synchronous semiconductor memory device having a reliable row chain precharge function.

To achieve the above objects, the semiconductor memory device according to the present invention includes a plurality of memory banks, a row address strobe signal buffer, a column address signal buffer and a column address generator, and performs a data access operation corresponding to the burst length and latency information related to a system clock having a predetermined frequency. Also included is a device which generates a precharge signal for automatically precharging one memory bank in response to the row address strobe signal, the signal having burst length and latency information after the address operation for one memory bank is completed. Such a precharge signal is transferred to the row address strobe signal buffer, thereby allowing the row address strobe signal buffer to precharge one memory bank.

BRIEF DESCRIPTION OF THE DRAWINGS

In the detailed description of the preferred embodiments of the present invention presented below, reference is made to the accompanying drawings, in which.

DETAILED DESCRIPTION OF THE PREFERRED EMBODIMENT

Figure 1:
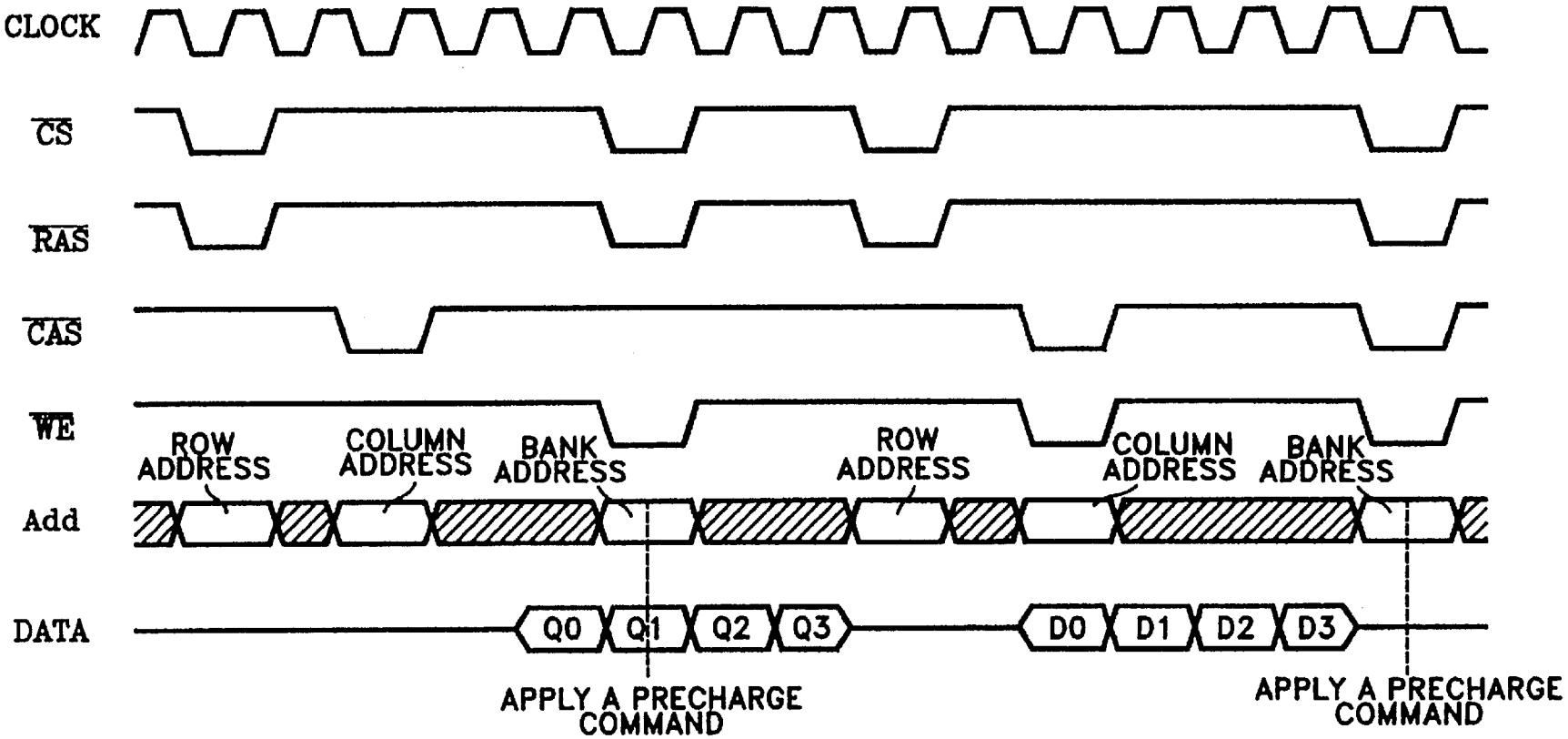
(PRIOR ART) FIG. 1
FIG. 1 is a timing diagram showing an operation according to a conventional precharge method.
Figure 2:
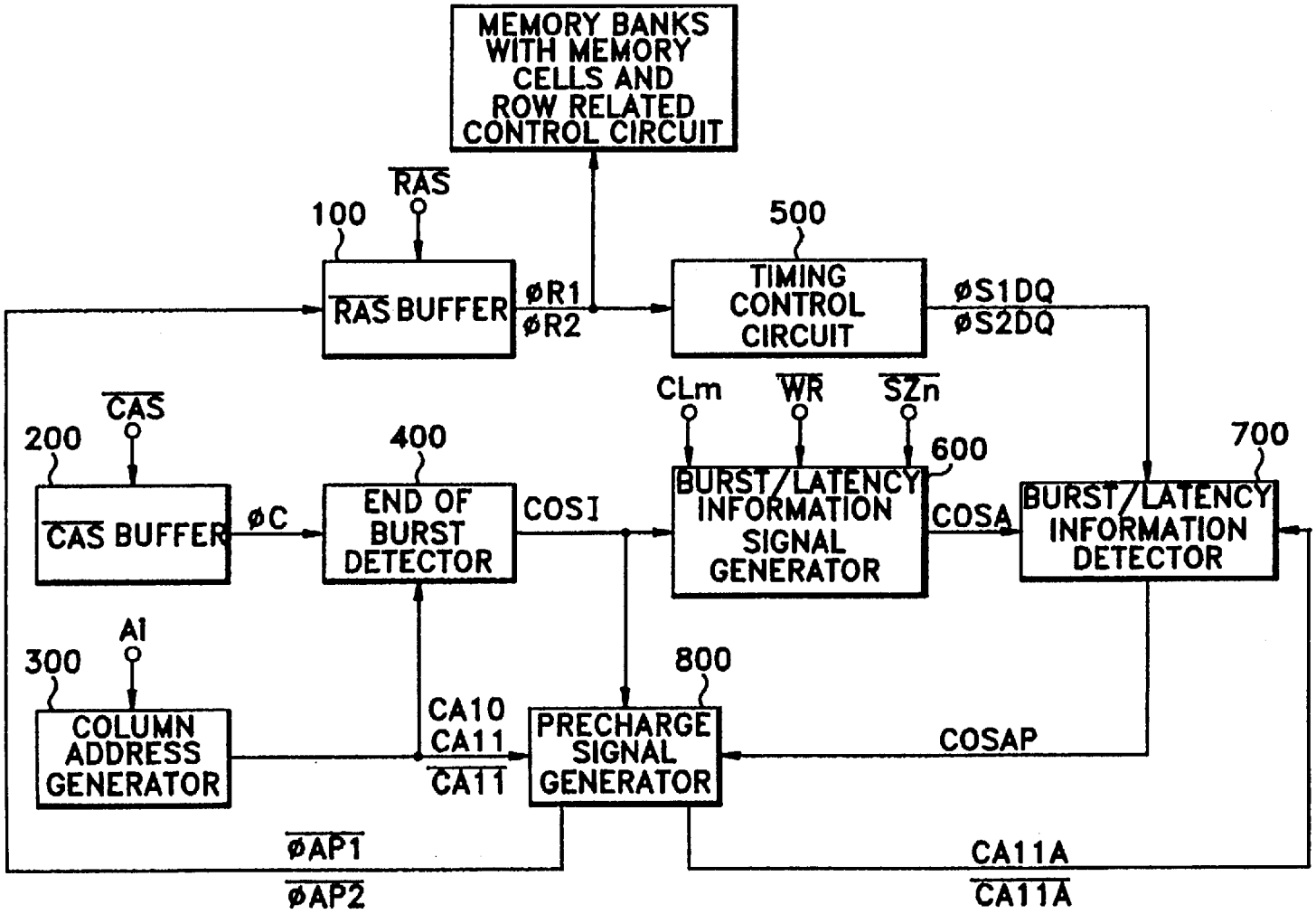
FIG. 2 is a block diagram showing a construction for embodying an auto-precharge function according to the present invention.

The construction of FIG. 2 required in realizing an auto precharge function according to the present invention includes a $\overline{RAS}$ buffer 100 that receives a row address strobe signal $\overline{RAS}$ and then generates row master clocks ϕR1 and ϕR2. A $\overline{CAS}$ buffer 200 receives a column address strobe signal $\overline{CAS}$ and then generates a column master clock ϕC which drives column related control circuits. A column address generator 300 receives and buffers an address signal Ai to a CMOS level and then generates a plurality of column address signals (include CA10, CA11 and $\overline{CA11}$) from the buffed address signal. An end of burst detector 400 receives the column master clock ϕC and the counted column address signals and then generates a burst length detection signal COSI which detects the end state of the burst length. A timing controller 500 receives the row master clocks ϕR1 and ϕR2 and then generates timing control signals ϕS1DQ and ϕS2DQ. A burst/latency information signal generator 600 receives the burst length detection signal COSI, $\overline{CAS}$ latency information signal CLm (wherein "m" indicates the latency value), $\overline{WE}$ activating information signal ϕWR (wherein $\overline{WE}$ is a write enable signal) and a burst length signal $\overline{SZn}$ (wherein "n" indicates the burst length) and then generates a burst/latency information signal COSA. A burst/latency information detector 700 receives the timing control signals ϕS1DQ and ϕS2DQ, the burst/latency information signal COSA and column address activating detection signals CA11A and $\overline{CA11A}$ generated from a precharge signal generator 800 and then generates a burst/latency information detection signal COSAP. The precharge signal generator 800 receives the column address signals CA10, CA11 and $\overline{CA11}$, the burst length detection signal COSI and the burst/latency information detection signal COSAP and then generates and supplies precharge signals $\overline{\Phi AP1}$ and $\overline{\Phi AP2}$ to the $\overline{RAS}$ buffer 100 and the column address activating detection signals CA11A and $\overline{CA11A}$ to the burst/latency information detector 700.

Figure 3:
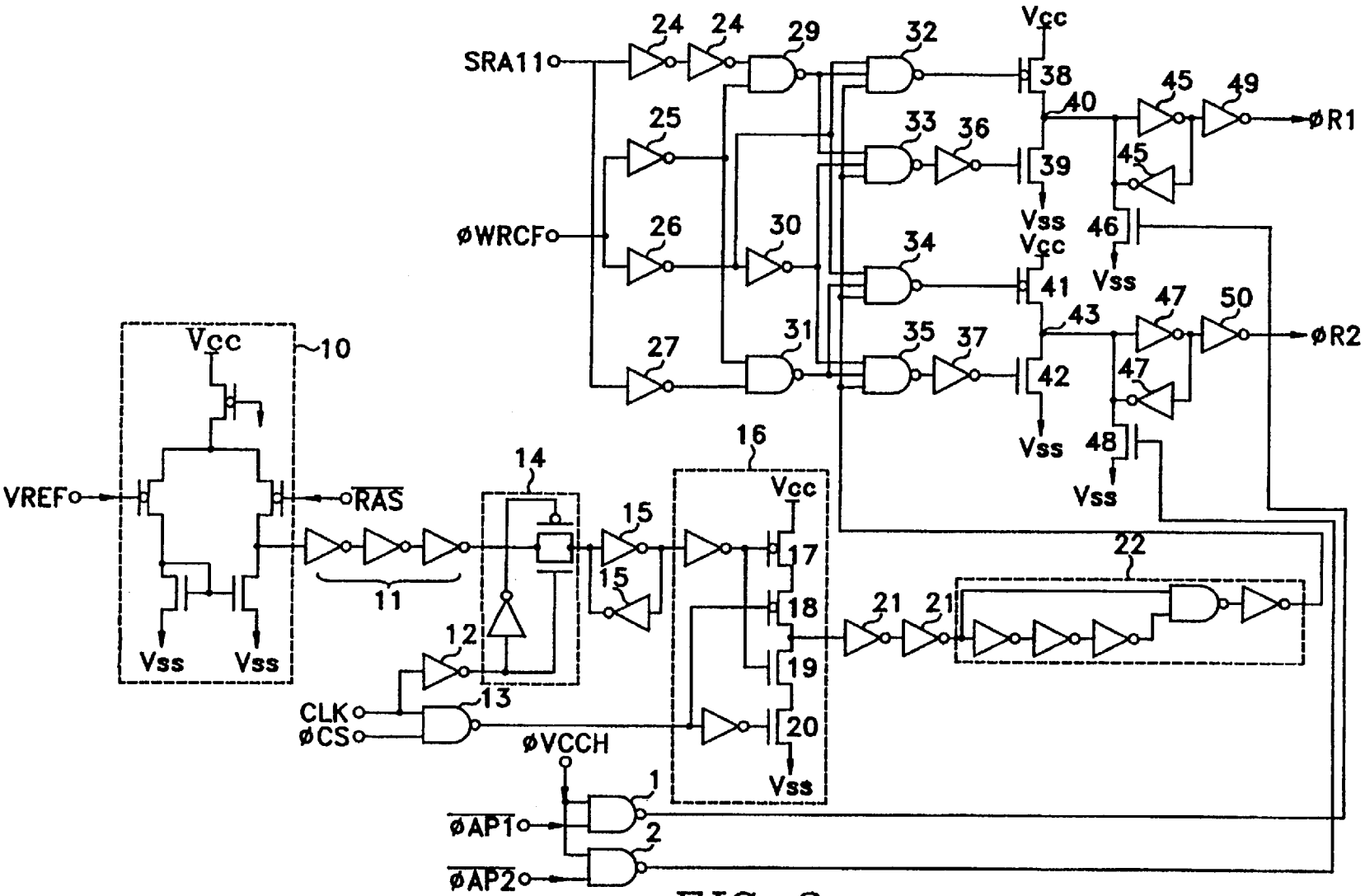
FIG. 3 is a circuit diagram showing a RAS buffer according to the present invention as shown in FIG. 2.

FIG. 3 is a detailed circuit diagram showing the $\overline{RAS}$ buffer 100 of FIG. 2, showing a minimum construction required in realizing the auto precharge function according to the present invention. A P-channel input type differential amplifier 10 receives the reference voltage VREF and the row address strobe signal $\overline{RAS}$, amplifies the row address strobe signal $\overline{RAS}$ as much as the voltage difference therebetween and then outputs the internal column address strobe signal $\overline{RAS}$ which has been shaped to a CMOS level. The output of the differential amplifier 10 is applied to a transfer gate circuit 14 via three inverters 11. The operation of the transfer gate circuit 14 is controlled by the system clock CLK. The signal passed through the transfer gate circuit 14 is supplied to a latch 15. The output of the latch 15 is converted and then applied to the PMOS transistor 17 and NMOS transistor 19 of an inverter 16. The source of the PMOS transistor 17 is coupled to the power supply voltage Vcc, and the drain of the NMOS transistor 19 to the output terminal of the inverter 16. The output of the NAND gate 13 which receives the system clock CLK and chip selection signal ϕCS is applied to the gate of a PMOS transistor 18 connected between the drains of the PMOS transistor 17 and NMOS transistor 19, and the converted output thereof is applied to the gate of a NMOS transistor 20 connected between the NMOS transistor 19 and the substrate voltage Vss (ground voltage). The output of the inverter 16 is supplied to the pulse shaping circuit 22 via two inverters 21.

The address signal SRA11 which selects the memory bank is applied to a NAND gate 29 via two inverters 24 and to a NAND gate 31 via an inverter 27. The signal ϕWRCF which is activated after the write activating signal $\overline{WE}$ has been activated is applied to the NAND gates 29 and 31 via an inverter 25 and to the NAND gates 32 and 34 via an inverter 26. The output of the NAND gate 29 is applied to the NAND gates 32 and 33. The output of the inverter 26 is applied to the NAND gates 33 and 35 via an inverter 30. The output of the NAND gate 31 is applied to the NAND gates 34 and 35. The output of the pulse shaping circuit 22 is commonly supplied to the NAND gates 32, 33, 34 and 35. The output of the NAND gate 32 is applied to the gate of a PMOS transistor 38 the source-drain path of which is connected between the power supply voltage Vcc and a first detection node 40. The output of the NAND gate 33 is applied via an inverter 36 to the gate of an NMOS transistor 39 the drain-source path of which is connected between the first detection node 40 and the substrate voltage Vss (ground voltage). The output of the NAND gate 34 is applied to the gate of a PMOS transistor 41 the source-drain path of which is connected between the power supply voltage Vet and a second detection node 43. The output of the NAND gate 35 is applied via an inverter 37 to the gate of an NMOS transistor 42 the drain-source path of which is connected between the second detection node 43 and the substrate voltage Vss.

Between the first detection node 40 and the substrate voltage Vss is connected the drain-source path of an NMOS transistor 46 having its gate connected to the output of the NAND gate 1 which receives the power supply voltage level detection signal ϕVCCH and the first precharge signal $\overline{\Phi AP1}$ generated from the precharge signal generator 800 of FIG. 2. In the same way, between the second detection node 43 and the substrate voltage Vss is connected the drain-source path of the NMOS transistor 48 having its gate connected to the output of the NAND gate 2 which receives the power supply voltage level detection signal ϕVCCH and the second precharge signal $\overline{\Phi AP2}$ generated from the precharge signal generator 800 of FIG. 2. The signals on the first and second detection nodes 40 and 43 are respectively generated as the first and second row master clocks ϕR1 and ϕR2 via the latches 45 and 47 and the inverters 49 and 50. The row master clocks ϕR1 and ϕR2 are supplied to the row related control circuits, that is, to the circuits which control the memory bank and drive the word lines therein.

Figure 4:
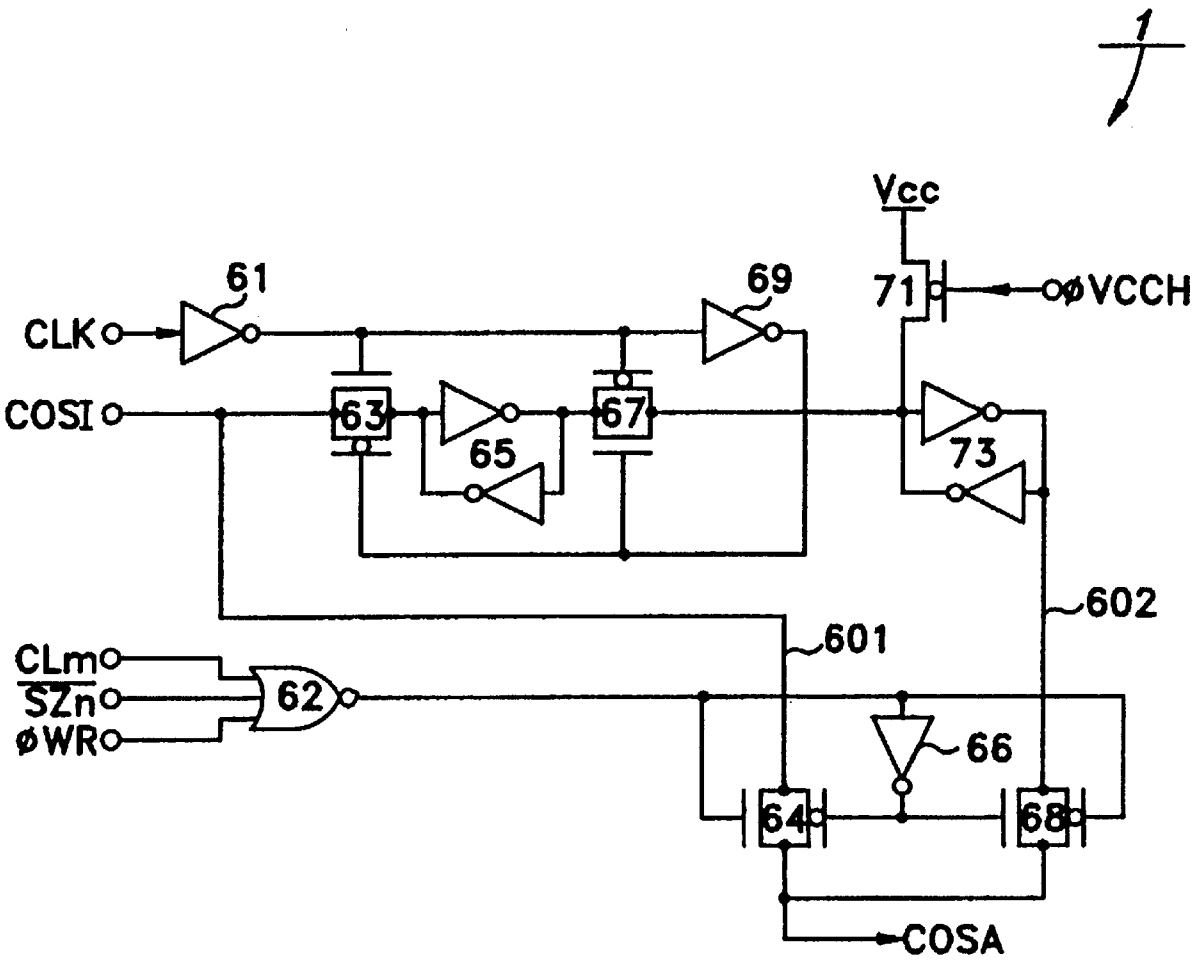
FIG. 4 is a circuit diagram showing a burst/latency information signal generator according to the present invention as shown in FIG. 2.

FIG. 4 is a detailed circuit diagram showing the burst/latency information signal generator 600 in FIG. 2. The burst length detection signal COSI generated from the end of the burst detector 400 in FIG. 2. is transferred to a latch 73 via the CMOS type transfer gate 63, latch 65 and transfer gate 67. The n type electrode of the transfer gate 63 and the p type electrode of the transfer gate 67 are controlled by the system clock CLK which has been converted by an inverter 61. The p type electrode of the transfer gate 63 and the n type electrode of the transfer gate 67 are controlled by the system clock CLK which has been passed through the inverters 61 and 69. The source-drain path of a PMOS transistor 71 is connected between the power supply voltage Vcc and a latch 73, and the power supply voltage level detection signal ϕVCCH is applied to the gate thereof. The burst length detection signal COSI is output as the burst/latency information signal COSA via a transfer gate 64, and the output of the latch 73 is also outputted as the burst/latency information signal COSA via a transfer gate 68. The transfer gates 64 and 68 are controlled in response to the output of a NOR gate 62 which receives the $\overline{CAS}$ latency information signal CLm, the burst length signal $\overline{SZn}$ and the $\overline{WE}$ activating information signal ϕWR. The n type electrode of the transfer gate 64 and the p type electrode of the transfer gate 68 are directly coupled to the output of the NOR gate 62, and the p type electrode of the transfer gate 64 and the n type electrode of the transfer gate 68 are controlled by the output of the NOR gate 62 which has been passed through an inverter 66. The burst/latency information signal COSA generated via the transfer gates 64 and 68 are transferred to the burst/latency information detector 700 in FIG. 2.

Figure 5:
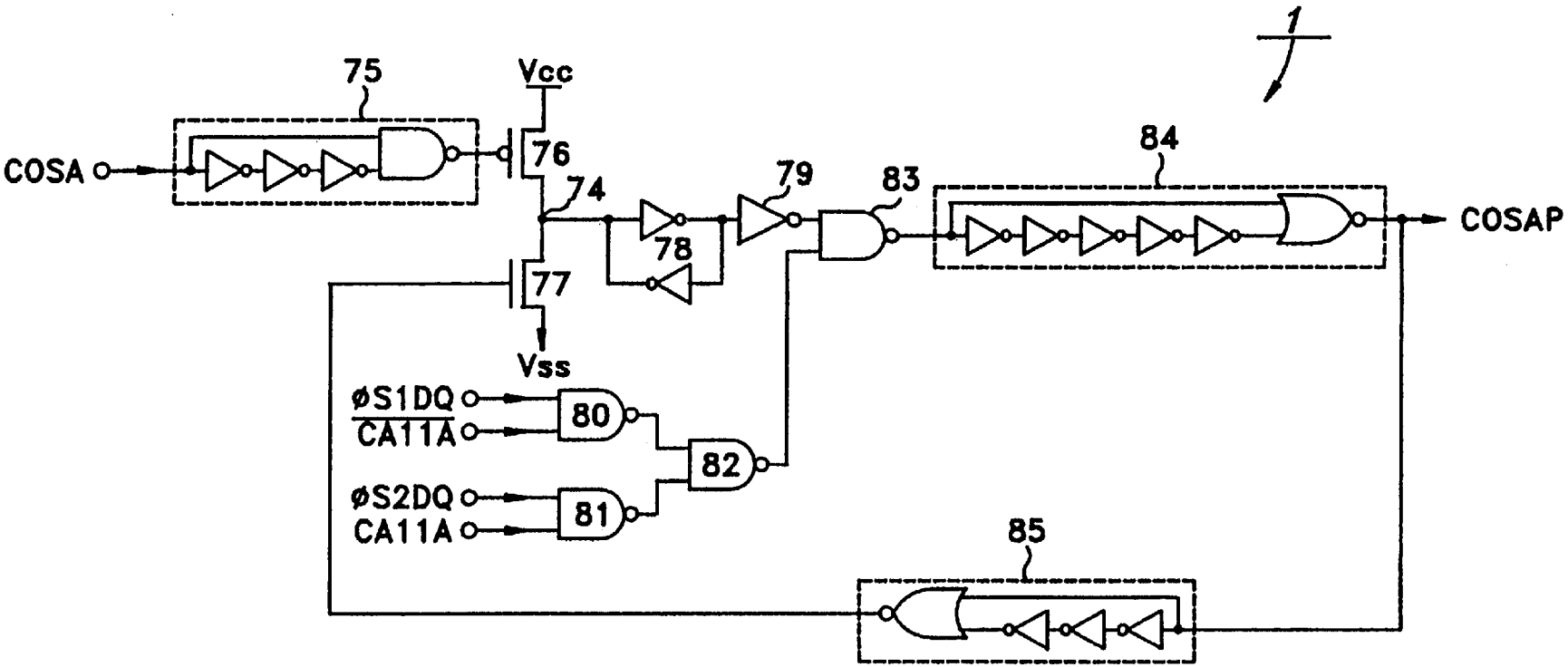
FIG. 5 is a circuit diagram showing a burst/latency information signal detector according to the present invention as shown in FIG. 2.

FIG. 5 is a detailed circuit diagram showing the burst/latency information detector 700 in FIG. 2. The burst/latency information signal COSA is applied to a pulse shaping circuit 75, and the output of the pulse shaping circuit 75 is coupled to the gate of a PMOS transistor 76 the source-drain path of which is connected between the power supply voltage Vcc and a node 74. The drain-source path of an NMOS transistor 77 is coupled between the node 74 and the substrate voltage Vss. The node 74 is coupled to the input of a NAND gate 83 via a latch 78 and an inverter 79. Another input of the NAND gate 83 is coupled to the output of the NAND gate 82 which outputs the logic comparison combination state between the column address activating detection signals CA11A and $\overline{CA11A}$ generated from the precharge generator 800 in FIG. 2 and the timing control signals ϕS1DQ and ϕS2DQ generated from the timing controller 500 in FIG. 2. The timing control signal ϕS1DQ and the column address activating detection signal $\overline{CA11A}$ are applied to a NAND gate 80, and the timing control signal ϕS2DQ and the column address activating detection signal CA11A to a NAND gate 81. The outputs of the NAND gates 80 and 81 are applied to a NAND gate 82. The output of a NAND gate 83 is generated as the burst/latency information detection signal COSAP via the pulse shaping circuit 84, and the output of the pulse shaping circuit 84 is connected to the gate of the NMOS transistor 77 via the pulse shaping circuit 85.

Figure 6:
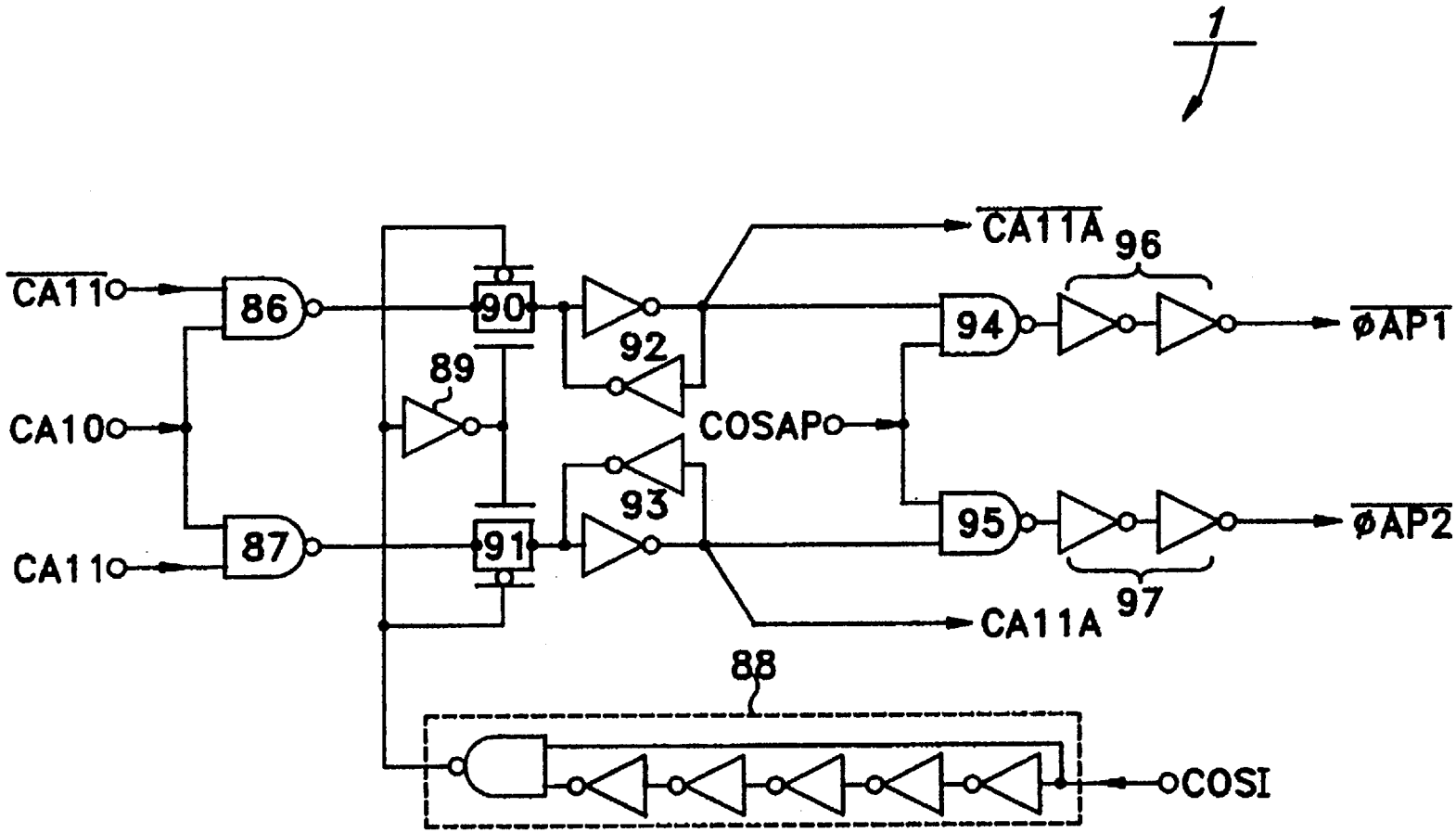
FIG. 6 is a circuit diagram showing a precharge signal generator according to the present invention as shown in FIG. 2.

FIG. 6 is a detailed circuit diagram showing the precharge signal generator 800 in FIG. 2. The column address signal $\overline{CA11}$ and CA11 are respectively applied to the NAND gates 86 and 87, and the column address signal CA10 is commonly applied to the NAND gates 86 and 87. The output of the NAND gate 86 is generated as the column address activating detection signal $\overline{CA11A}$ via a transfer gate 90 and a latch 92, and the output of the NAND gate 87 is generated as the column address activating detection signal CA11A via a transfer gate 91 and a latch 93. The transfer gates 90 and 91 are controlled by the output of the pulse shaping circuit 88 which receives the burst length detection signal COSI. The p type electrodes of the transfer gates 90 and 91 are directly coupled to the output of the pulse shaping circuit 88, and the n type electrodes thereof are coupled to the output of the pulse shaping circuit 88 which has been passed through an inverter 89. The output of the latches 92 and 93 are respectively applied to the NAND gates 94 and 95 which commonly receive the burst/latency information detection signal COSAP. The outputs of the NAND gates 94 and 95 are respectively generated as the first and second precharge signals $\overline{\Phi AP1}$ and $\overline{\Phi AP2}$ via the inverters 96 and 97.

Figure 7:
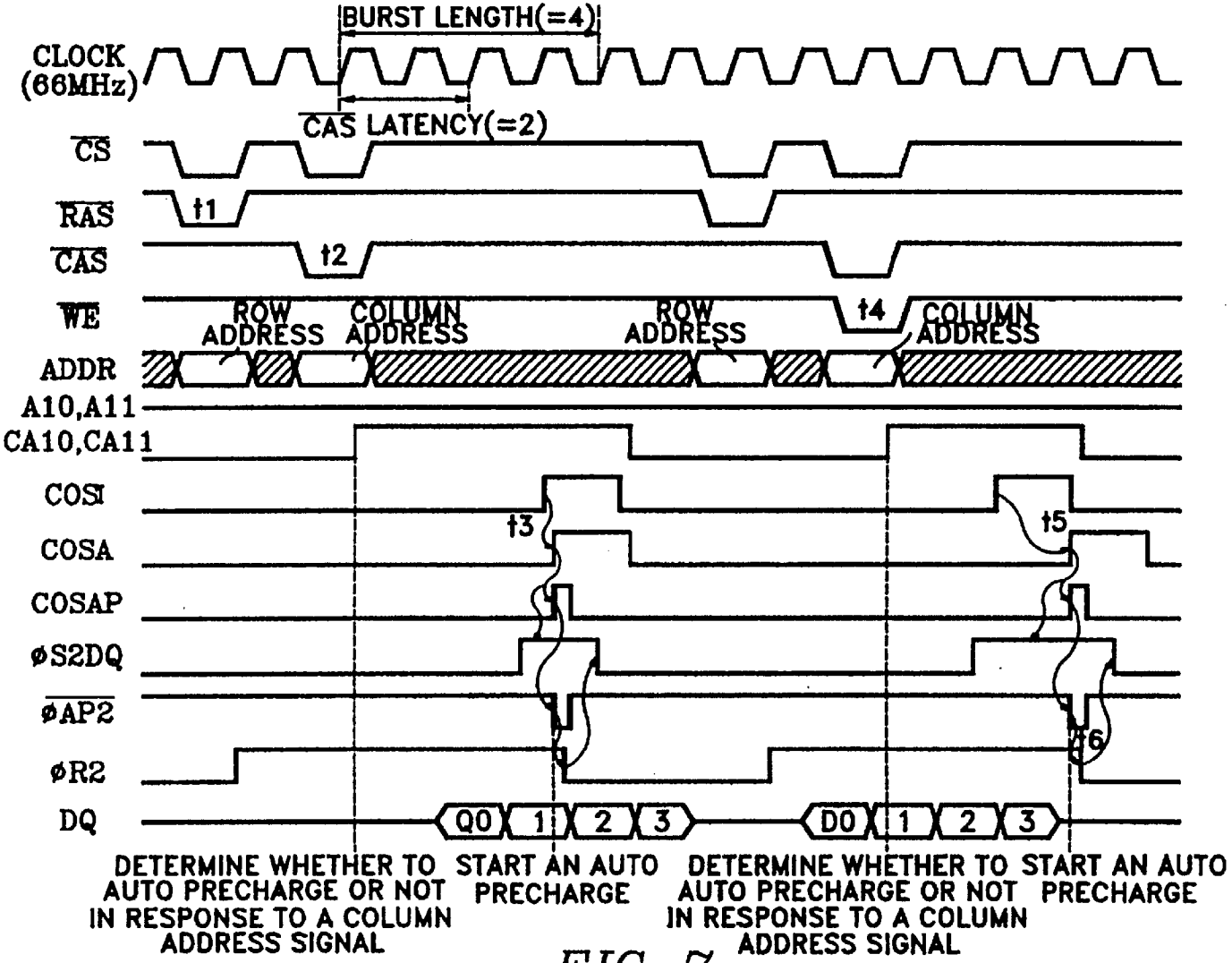
FIG. 7 is a timing diagram showing an operation according to an auto precharge method of the present invention, assuming that a system clock is 66 MHz, burst length is 4 and CAS latency is 2.

Referring to the timing diagram of FIG. 7, the auto precharge operation according to the present invention will now be described, assuming that the frequency of the system clock CLK is 66 MHz, the burst length is 4 and the $\overline{CAS}$ latency value is 2. First, the auto precharge process in a read cycle which starts from time t1 will be described. At time t1, if the row address strobe signal $\overline{RAS}$ is activated to a low state, the row address is latched. Referring now to FIG. 3, the output of the differential amplifier 10 becomes a logic high state by the activated row address strobe signal $\overline{RAS}$, and if the system clock CLK is in the logic low state, the signal of the logic low state is applied to the gate of the PMOS transistor 17 of the inverter 16. The system clock CLK is rendered to the logic high state (clock 1), the transfer gate circuit 14 turns off and the P-channel transistor 18 of the inverter 16 turns on (the chip selection signal ϕCS maintains at the logic high state in operation), with the result of that the output of the inverter 16 is rendered to the logic high state. Thus, the output of the pulse shaping circuit 22 becomes a short pulse of logic high state and then is applied to the NAND gates 32, 33, 34 and 35, thus activating those NAND gates. Since the signal ϕWRCF is in the logic low state (because the write activating signal $\overline{WE}$ is inactivated.), if the bank selection signal SRA11 is rendered to the logic high state, the row master clock ϕR2 of logic high state is generated by the PMOS transistor 41 which has been turned on by the output of the NAND gate 34 of logic low state. Assuming that this row master clock ϕR2 is supplied to the row related circuits for the second memory bank (the present invention is applied to the semiconductor memory device having two memory banks), in as much as the bank selection signal SRA11 of logic high state is input, the row master clock ϕR2 maintains at the logic high state by the latch 47 as shown in FIG. 7. On the contrary, if the bank selection signal SRA11 of logic low state is inputted, the row master clock ϕR1 of logic high state instead of the row master clock ϕR2 is outputted, to activate the row related circuits for the first memory bank.

At time t2, as the column address strobe signal $\overline{CAS}$ is activated, the column address CAi is latched. Whether to auto precharge or not is determined by using the logic state of the column address signals CA10 and CA11. That is, as shown in FIG. 7, if the column address signals CA10 and CA11 are in the logic high state, it is determined to perform the auto precharge operation.

If m is 3 in the $\overline{CAS}$ latency information signal CLm (which becomes logic high state when the $\overline{CAS}$ latency is "3") and n is 2 in the burst length signal $\overline{SZn}$ (which becomes logic high state when the burst length is "2") in FIG. 4, since the $\overline{CAS}$ latency is "2", and the burst length is "4" in FIG. 7, both CL3 and $\overline{SZ2}$ are in the logic low state. Also, being in a read cycle, $\overline{WE}$ activating information signal ϕWR remains at the logic low state. Thereby, the transfer gate 64 turns on and the transfer gate 68 turns off, so that the burst length detection signal COSI which has been activated at time 13 is generated as the burst/latency information signal COSA of logic high state via the transfer gate 64 (hereinafter referred to as a "direct transfer path 601"). Referring to FIG. 5, the burst/latency information signal COSA of logic high state is passed through the pulse shaping circuit 75 and then is applied to the gate of the PMOS transistor 76 as a short pulse of logic low state. Then, the short pulse of logic high state is applied from the node 74 to the NAND gate 83 via the latch 78 and the inverter 79. Since the timing control signal ϕS1DQ and the column address activating detection signal $\overline{CA11A}$ are in the logic low state and the timing control signal ϕS2DQ and the column address activating detection signal CA11A are in the logic high state, the output of the NAND gate 82 to be applied to the NAND gate 83 is rendered to the logic high state. Hence, the output of the NAND gate 83 becomes the signal of logic low state. Consequently, the signal of logic low state is outputted through the pulse shaping circuit 84 as the burst/latency information detection signal COSAP of logic high state of the short pulse, as shown in FIG. 7. The pulse shaping circuit 85 which forms the feedback loop between the pulse shaping circuit 84 and the NMOS transistor 77 detects that the burst/latency information detection signal COSAP of logic high state has been changed to the logic low state and then applies the short pulse signal of logic high state to the gate of the NMOS transistor 77, thus serving to inactivate the burst/latency information detection signal COSAP.

Referring to FIG. 6, the column address activating detection signals $\overline{CA11A}$ and CA11A are respectively generated in the logic low and high states from the latches 92 and 93 by the column address signals CA10 and CA11 of logic high state. The transfer gates 90 and 91 are turned on by the short pulse of logic low state which responds to the burst length detection signal COSI of logic high state. Thus, the latches 92 and 93 keep the logic state of the stored column address signal CA11 by the burst length detection signal COSI. Since the burst/latency information detection signal COSAP generated from FIG. 5 is in the logic high state, the first precharge signal $\overline{\Phi AP1}$ is rendered to the logic high state (inactive state) and the second precharge signal $\overline{\Phi AP2}$ to the logic low state (active state).

Referring to FIG. 3, the first and second precharge signals $\overline{\Phi AP1}$ and $\overline{\Phi AP2}$ respectively generated in the logic high and low states from FIG. 6 are respectively applied to the NAND gates 1 and 2. Accordingly, the signal of logic low state is applied to the gate of the NMOS transistor 46 connected between the detection node 40 and the substrate voltage Vss, and the signal of logic high state to the gate of the NMOS transistor 48 connected between the detection node 43 and the substrate voltage Vss. As a result, the row master clock ϕR2 which has been kept at the logic high state is changed to the logic low state by the turn on of the pull-down NMOS transistor 48, as shown in FIG. 6. That is, as the row master clock ϕR2 which has been activated to drive the second memory bank (e.g. the driving for the read operation) is inactivated, the second memory bank automatically performs the precharge operation. The precharge operation of the second memory bank (not shown) is performed in a well known way, and such will not be described in the preferred embodiment of the present invention. In the prior art, the precharge command must be forcibly applied from the external in order to precharge any memory bank after the read operation of one cycle is completed.

In the auto precharge operation for the write cycle which starts at time t4, since $\overline{WE}$ activating information signal ϕWR becomes logic high rate in FIG. 4 as the write activating signal $\overline{WE}$ is activated to the logic low state at time t5, the burst/latency information signal COSA is generated after being delayed as much as one clock of the system clock CLK from the burst length detection signal COSI, as shown in FIG. 7. That is, as the clock 14 of the system clock CLK is changed to the logic low state, the burst length detection signal COSI is passed through the transfer gate 63 to be stored at the latch 65 (at this time, the transfer gate 67 is turned off.), and as the clock 15 of the system clock CLK is changed to the logic high state, the signal stored at the latch 65 is passed through the transfer gate 67, the latch 73 and the transfer gate 68 (hereinafter referred to as a "delay path 602") and then is generated as the burst/latency information signal COSA which is delayed as much as one clock from the burst length detection signal COSI. The remaining steps are equal to the case of the aforementioned read cycle, and the auto precharge operation for the second memory bank is performed as the row master clock ϕR2 which activates the second memory bank at time t6 is inactivated to the logic low state by the second precharge signal $\overline{\Phi AP2}$ of logic low state.

Figure 8:
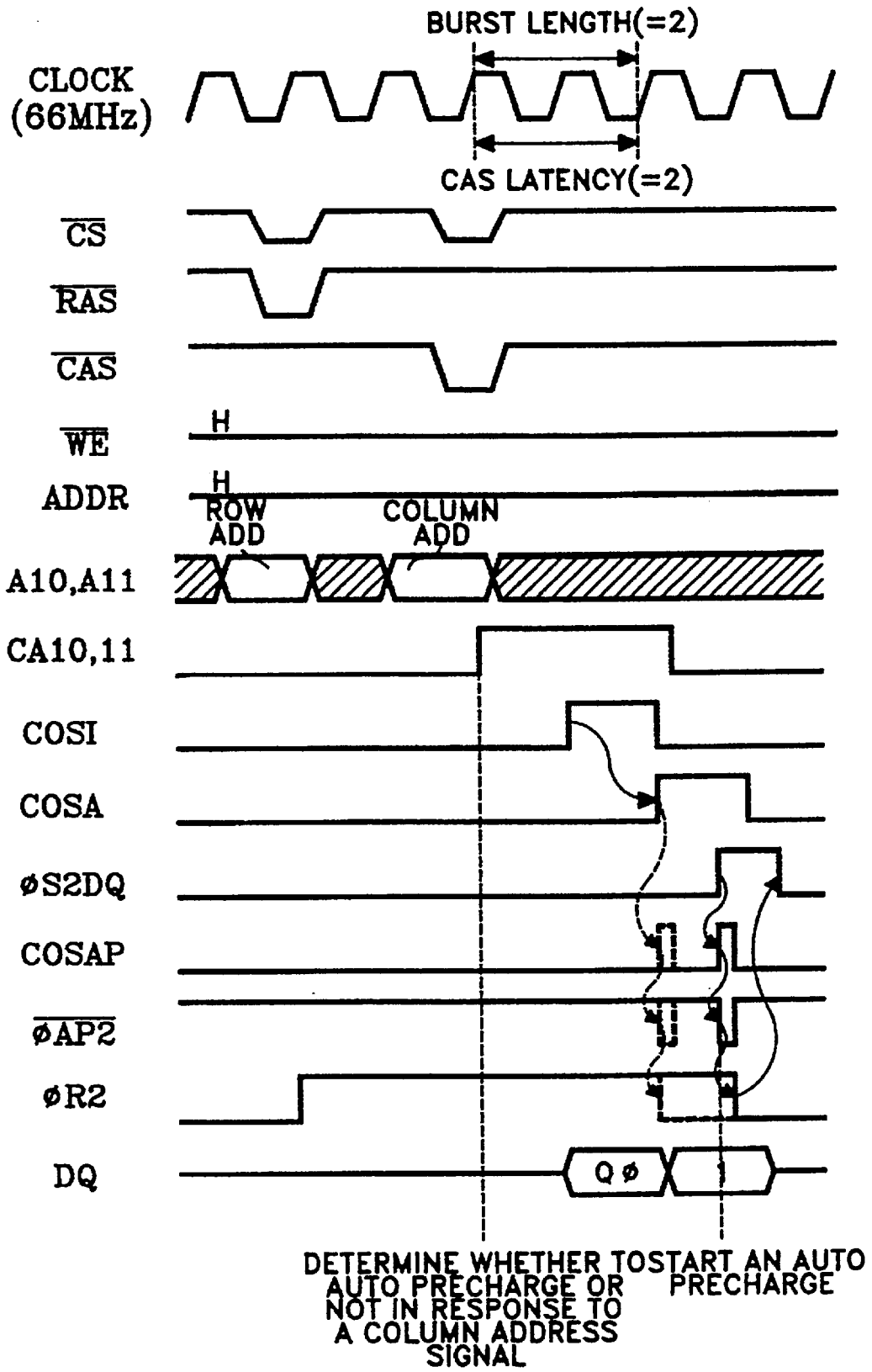
FIG. 8 is a timing diagram showing an operation according to an auto precharge method of the present invention, assuming that the system clock is 66 MHz, burst length is 2 and CAS latency is 2.

Referring to FIG. 8 showing the auto precharge method according to the present invention in case of the burst length being 2, as the burst length signal $\overline{SZn}$ (n=2) is in the logic high state and the output of the NOR gate 62 is thus rendered to the logic low state, the burst length detection signal COSI is transferred via the delay path 602. Consequentially, the burst/latency information signal COSA is generated after being delayed as much as one clock of the system clock CLK from the burst length detection signal COSI. In addition, since the burst/latency information signal COSA which has been outputted as the short pulse through the pulse shaping circuit 75 corresponds to the logic state of the timing control signal ϕS2DQ which is generated with the lapse of a predetermined time from the activation time point of $\overline{RAS}$ in order to pass through the NAND gate 83, if the timing control signal ϕS1DQ is in the logic high state, the burst/latency information detection signal COSAP is rendered to the logic high state. The dotted line in FIG. 8 shows the case that $\overline{RAS}$ information does not control the auto precharge. As a result, FIG. 8 shows the fact that the burst/latency information detection signal COSAP required in generating the auto precharge signals $\overline{\Phi AP1}$ and $\overline{\Phi AP2}$ is influenced by the information related to $\overline{RAS}$ as well as the information related to the burst length and $\overline{CAS}$ latency.

Thus, since the auto precharge signal according to the present invention is generated corresponding to information related to the burst length and latency used in the synchronous semiconductor memory device, as well as the information related to the row and column address strobe signals $\overline{RAS}$ and $\overline{CAS}$ that are typically used in data access operations in semiconductor memory devices, an effective and reliable auto precharge function can be achieved.

The above-described embodiment of the present invention utilizes the circuit constructions as shown in FIGS. 4 to 7 in order to reflect the information required in generating the auto precharge signal, however, the auto precharge signal according to the present invention can be generated with another circuit construction.

What is claimed is:

1. A semiconductor memory device using row and column address strobe signals comprising:

a plurality of memory banks each including a plurality of memory cells; and means for generating a signal which automatically precharges at least one memory bank of said memory banks in response to receiving a signal which corresponds to said row and column address strobe signals after an address operation for said memory bank is completed, said address operation activating at least one of said plurality of memory cells.

2. A semiconductor memory device which performs a data access operation in response to burst length and latency information related to a system clock having a predetermined frequency, said semiconductor memory device comprising:

a plurality of memory banks;

a row address strobe signal buffer;

a column address strobe signal buffer;

a column address generator; and means for generating a signal which automatically precharges one memory bank of said memory banks in response to said column address strobe signal and said burst length and latency information after an address operation for said memory bank is completed.

3. A semiconductor memory device which performs a data access operation in response to burst length and latency information related to a system clock having a predetermined frequency, said semiconductor memory device comprising:

a plurality of memory banks each including a plurality of memory cells;

a circuit generating a row master clock for driving row related control circuits which are included in one memory bank of said memory banks in response to a row address strobe signal applied externally and a bank selection signal; and a circuit which generates said row master clock, said circuit being supplied with a signal generated in response to said row address strobe signal and said burst length and latency information after an address operation for one memory bank of said memory banks is completed, said address operation activating at least one of said plurality of memory cells.

4. A semiconductor memory device which performs a data access operation in response to burst length and latency information related to a system clock having a predetermined frequency, said semiconductor memory device comprising:

a plurality of memory banks including a plurality of memory cells;

a row master clock generating circuit which generates a row master clock for driving row related control circuits that are included in one memory bank of said memory banks in response to a row address strobe signal applied externally and a bank selection signal;

a column master clock generating circuit which receives a column address strobe signal externally and then generates a column master clock for driving column related control circuits which are included in said one memory bank of said memory banks, a column address generating circuit which receives address signals externally and then generates column address signals; and a circuit which generates said row master clock, said circuit being supplied with a signal generated in response to said row address strobe signal and said burst length and latency information after an address operation for one memory bank of said memory banks is completed, said address operation activating at least one of said plurality of memory cells.

5. A semiconductor memory device having a plurality of memory banks including a plurality of memory cells, and a circuit generating a row master clock for driving row related control circuits which are included in one memory bank of said memory banks in response to a row address strobe signal applied externally and a bank selection signal, a circuit receiving a column[a] address strobe signal externally and then generating a column master clock for driving column related control circuits which are included in one memory bank of said memory banks, and a circuit receiving address signals externally and then generating column address signals and performing a data access operation in response to burst length and latency information related to a system clock having a predetermined frequency, said semiconductor memory device comprising:

means for generating a timing control signal corresponding to said row master clock;

a circuit which receives said timing control signal and said burst length and latency information and then generates said column address strobe signal and an information detection signal derived from said burst length and latency information; and means for transferring to a circuit which generates said row master clock a precharge signal responding to a signal which contains said burst length, a column address signal and said information detection signal.

*6. A method of operating a semiconductor memory device responsive to row and column address strobe signals, comprising the steps of:*

*addressing at least one memory cell in a bank of memory cells; and*

*generating a signal which automatically precharges the bank of memory cells in response to receiving a signal which corresponds to the row and column address strobe signals after said addressing step is completed.*

*7. A method of operating a semiconductor memory device, comprising the steps of:*

*generating a column address strobe signal;*

*addressing at least one memory cell in a bank of memory cells; and*

*generating a signal which automatically precharges the bank of memory cells in response to the column address strobe signal and burst length and latency information which is related to a system clock having a predetermined frequency, after said addressing step has been completed.*

*8. A method of operating a semiconductor memory device, comprising the steps of:*

*addressing at least one memory cell in a bank of memory cells;*

*generating a row master clock signal from row related control circuits electrically coupled to the bank of memory cells, in response to a row address strobe signal and a bank selection signal; and*

*generating a signal to precharge the bank of memory cells, in response to the row address strobe signal and burst length and latency information which is related to a system clock having a predetermined frequency, after said addressing step has been completed.*

*9. The method of claim 8, further comprising the steps of:*

*generating a column master clock signal in response to a column address strobe signal; and*

*generating a column address which contains bank selection information and autoprecharge information, in response to an address.*

*10. The method of claim 8, further comprising the steps of:*

*generating a timing control signal in response to the row master clock signal;*

*generating a burst/latency information detection signal in response to the timing control signal.*

*11. The method of claim 10, wherein a timing of said step of generating a burst/latency information detection signal varies depending on a value of the burst length and a value of the latency information; and wherein said step of generating a signal to precharge the bank of memory cells is performed in response to the burst/latency information detection signal.*

*12. A method of operating a synchronous DRAM memory device during a burst reading mode, comprising the steps of:*

*activating a row master clock signal during a first time interval;*

*generating a column address in response to a column address strobe signal;*

*reading data from the memory device during the first time interval, in response to the column address strobe signal;*

*generating a precharge signal during the first time interval, in response to the column address;*

*deactivating the row master clock signal in response to the precharge signal; and*

*precharging the memory device during a second time interval following the first time interval, in response to the precharge signal.*

*13. The method of claim 12, further comprising the steps of:*

*activating a column master clock signal during the first time interval, in response to the column address strobe signal; and*

*generating a burst length detection signal during the first time interval, in response to the column address and the column master clock signal; and*

*wherein said step of generating a precharge signal comprises generating a precharge signal during the first time interval, in response to the column address and the burst length detection signal.*

*14. The method of claim 13, further comprising the steps of:*

*generating a column address activating detection signal, in response to the column address and the burst length detection signal; and*

*generating a timing control signal, in-sync with said step of activating a row master clock signal.*

*15. The method of claim 14, further comprising the steps of:*

*generating a burst/latency information signal, in response to the burst length detection signal; and*

*generating a burst latency information detection signal, in response to the burst/latency information signal, the timing control signal and the column address activating detection signal.*

*16. The method of claim 15, wherein said step of generating a precharge signal comprises generating a precharge signal during the first time interval, in response to the column address, the burst length detection signal and the burst latency information detection signal.*

*17. The method of claim 12, wherein said step of generating a precharge signal overlaps in time with said step of reading data from the memory device.*

*18. A method of operating a synchronous DRAM memory device during a burst mode having a burst length and a column address strobe latency, comprising the steps of:*

*activating a row master clock signal during a first time interval;*

*activating a word line electrically coupled to a row of memory cells in the memory device in response to the row master clock signal;*

*generating a column address in response to a column address strobe signal;*

*generating a burst length signal;*

*generating, in response to the column address, a precharge signal at a first point in the first time interval if the burst length does not correspond to the burst length signal and at a second point in the first time interval if the burst length corresponds to the burst length signal;*

*deactivating the row master clock signal in response to the precharge signal; and*

*precharging the memory device in response to the precharge signal.*

*19. The method of claim 18, wherein said step of precharging the memory device includes the step of deactivating the word line.*

*20. The method of claim 18, wherein the second point in the first time interval is delayed in time relative to the first point in the first time interval.*

*21. The method of claim 18, further comprising the step of generating a latency signal; and wherein said step of generating a precharge signal comprises generating, in response to the column address, a precharge signal at the first point in the first time interval if the burst length corresponds to the burst length signal and the latency signal corresponds to the column address strobe latency.*

*22. The method of claim 21, wherein said step of generating a precharge signal comprises generating, in response to the column address, a precharge signal at the second point in the first time interval if the burst length does not correspond to the burst length signal or if the column address strobe latency does not correspond to the latency signal.*

*23. The method of claim 22, wherein the second point in the first time interval is delayed in time relative to the first point in the first time interval.*

*24. A method of operating a synchronous DRAM memory device during a burst mode, comprising the steps of:*

*activating a row master clock signal during a first time interval;*

*activating a word line electrically coupled to a row of memory cells in the memory device in response to the row master clock signal;*

*writing data to the memory device during a write time interval;*

*reading data from the memory device during a read time interval;*

*generating a column address in response to a column address strobe signal;*

*generating, in response to the column address, a precharge signal at a first point in the first time interval if the read time interval overlaps the first time interval and at a second point in the first time interval if the write time interval overlaps the first time interval;*

*deactivating the row master clock signal in response to the precharge signal; and*

*precharging the memory device in response to the precharge signal.*

*25. The method of claim 24, wherein said step of precharging the memory device comprises the step of deactivating the word line.*

*26. The method of claim 24, wherein the second point in the first time interval is delayed in time relative to the first point in the first time interval.*

*27. A synchronous DRAM memory device, comprising:*

*a row address strobe buffer which activates a row master clock signal during a first time interval in response to a row address strobe signal and deactivates the row master clock signal at an end of the first time interval in response to a precharge signal;*

*a memory bank, responsive to the row master clock signal; and*

*a precharge signal generator which generates the precharge signal during the first time interval, in response to a column address.*

*28. The memory device of claim 27, wherein said precharge signal generator generates the precharge signal in response to the column address and a burst length detection signal.*

*29. The memory device of claim 27, further comprising an end-of-burst detector which generates a burst length detection signal in response to a column master clock signal; and wherein said precharge signal generator generates the precharge signal in response to the column address and a burst length detection signal.*

*30. The memory device of claim 29, further comprising:*

*a burst/latency information signal generator which generates a burst/latency information signal in response to burst length detection signal and at least one of a latency signal, a write enable activating information signal and a burst length signal; and*

*a timing control circuit which generates a timing control signal in response to the row master clock signal.*

*31. The memory device of claim 30, further comprising a burst/latency information detector which generates a burst latency information detection signal in response to the timing control signal and the burst/latency information signal; and wherein said precharge signal generator generates the precharge signal in response to the column address, the burst length detection signal and the burst latency information detection signal.*

*32. The memory device of claim 31, wherein said precharge signal generator generates a column address activating detection signal; and wherein said burst/latency information detector generates a burst latency information detection signal in response to the timing control signal, the burst/latency information signal and the column address activating detection signal.*

*33. A synchronous memory device, comprising:*

*an address generator which generates a first control signal in response to an auto-precharge command signal;*

*a burst detector which generates an end of burst signal by detecting a timing of an end of a burst operation; and*

*an auto-precharge signal generator which generates an auto-precharge signal to automatically precharge at least one memory bank of a plurality of memory banks in response to the end of burst signal and the first control signal.*

*34. A synchronous memory device, comprising:*

*an address generator which generates a first control signal in response to an auto-precharge command signal which is provided in sync with an external clock signal;*

*a burst detector which generates an end of burst signal by detecting a timing of an end of a burst operation;*

*an auto-precharge signal generator which generates an auto-precharge signal to automatically precharge at least one memory bank of a plurality of memory banks in response to the end of burst signal and the first control signal; and*

*a row addressing circuit which designates a row in a memory array in accordance with a given row address combination, and designates a precharging row in response to the auto-precharge signal.*

*35. A semiconductor memory device which performs a burst operation according to a predetermined latency information signal and a burst length information signal which are provided in-sync with an external clock signal, comprising:*

*a plurality of memory banks;*

*a burst detector which generates an end of burst signal by detecting a timing of an end of the burst operation; and*

*an auto-precharge signal generator which generates an auto-precharge signal to automatically precharge at least one of said plurality of memory banks in response to the end of burst signal and the latency information signal and the burst length information signal.*

*36. A semiconductor memory device which performs a burst operation according to a predetermined latency and burst length information set by a user, in-sync with an external clock signal, said semiconductor memory device comprising:*

*a plurality of memory banks;*

*a burst detector which generates an end of burst signal by detecting a timing of the end of said burst operation;*

*an auto-precharge signal generator which generates an auto-precharge signal to automatically precharge at least one memory bank of said plurality of memory banks in response to the end of burst signal and the predetermined latency and the burst length information, and wherein said auto-precharge signal is enabled when the burst operation is completed; and*

*a row addressing circuit which designates a row in the at least one memory bank in accordance with a given row address combination, and designates a precharging row in response to the auto-precharge signal.*

*37. The semiconductor memory device of claim 36, wherein the row addressing circuit designates a row in said plurality of memory banks in accordance with a given row address combination and precharges a row in at least one of said plurality of memory banks in response to the auto-precharge signal and a bank selection signal.*

* * * * *